(12) United States Patent
Maruchi (10) Patent No.: US 12,154,705 B2
(45) Date of Patent: Nov. 26, 2024

(54) WIRE HARNESS UNIT

(71) Applicant: SUMITOMO WIRING SYSTEMS, LTD., Yokkaichi (JP)

(72) Inventor: Takeo Maruchi, Yokkaichi (JP)

(73) Assignee: SUMITOMO WIRING SYSTEMS, LTD., Mie (JP)

( * ) Notice: Subject to any disclaimer, the term of this patent is extended or adjusted under 35 U.S.C. 154(b) by 29 days.

(21) Appl. No.: 18/020,816

(22) PCT Filed: Aug. 4, 2021

(86) PCT No.: PCT/JP2021/028872
§ 371 (c)(1),
(2) Date: Feb. 10, 2023

(87) PCT Pub. No.: WO2022/044734
PCT Pub. Date: Mar. 3, 2022

(65) Prior Publication Data
US 2023/0290540 A1    Sep. 14, 2023

(30) Foreign Application Priority Data
Aug. 26, 2020  (JP) .................. 2020-142642

(51) Int. Cl.
*H05K 9/00* (2006.01)
*B60R 16/02* (2006.01)
(Continued)

(52) U.S. Cl.
CPC ........... *H01B 7/42* (2013.01); *B60R 16/0222* (2013.01); *H01B 7/0045* (2013.01); *H05K 9/0098* (2013.01)

(58) Field of Classification Search
CPC .................................................... H05K 9/0098
See application file for complete search history.

(56) References Cited

U.S. PATENT DOCUMENTS

2007/0199730 A1   8/2007  Fazakas
2009/0167078 A1   7/2009  Watanabe
(Continued)

FOREIGN PATENT DOCUMENTS

JP    861-071505 A    4/1986
JP    2001-332139 A   11/2001
(Continued)

OTHER PUBLICATIONS

Oct. 5, 2021 International Search Report issued in International Patent Application No. PCT/JP2021/028872.

*Primary Examiner* — Hung V Ngo
(74) *Attorney, Agent, or Firm* — Oliff PLC (57) ABSTRACT

A wire harness unit including: a plurality of conductive paths for conducting electricity between in-vehicle devices; and a cooling tube through which a coolant is able to flow for cooling the plurality of conductive paths, wherein: the plurality of conductive paths include a first conductive path and a second conductive path parallel to the first conductive path, the first conductive path includes a first inner insulating layer that is hollow and tubular, and a first tubular conductor that covers an outer circumferential surface of the first inner insulating layer, and the second conductive path includes a second inner insulating layer that is hollow and tubular, and a second tubular conductor that covers an outer circumferential surface of the second inner insulating layer.

11 Claims, 7 Drawing Sheets

(51) Int. Cl.
*H01B 7/00* (2006.01)
*H01B 7/42* (2006.01)

(56) References Cited

U.S. PATENT DOCUMENTS

| | | |
|---|---|---|
| 2019/0164665 A1 | 5/2019 | Sato |
| 2019/0199075 A1 | 6/2019 | Sugimura et al. |
| 2021/0383946 A1* | 12/2021 | Chuganey ............ H01B 11/183 |

FOREIGN PATENT DOCUMENTS

| | | |
|---|---|---|
| JP | 2007-535784 A | 12/2007 |
| JP | 2018-018748 A | 2/2018 |
| JP | 2019-115253 A | 7/2019 |
| WO | 2007/032391 A1 | 3/2007 |

* cited by examiner

WIRE HARNESS UNIT

BACKGROUND

The present disclosure relates to a wire harness unit.

Conventionally, wire harnesses installed in vehicles such as hybrid cars and electric cars electrically connect a plurality of electrical devices to each other. Also, in electric cars, vehicles and ground facilities are connected to each other by a wire harness, and a power storage device installed in the vehicle is charged by the ground facility. As a result of a voltage supplied through the wire harness being high, the amount of heat generated by the wire harness is increased. For this reason, configurations for cooling wire harnesses have been proposed.

For example, JP 2019-115253A discloses a wire harness provided with a coated wire, an inner tube that covers the coated wire, and an outer tube that covers the inner tube with a predetermined space therebetween, in which a circulation path for a coolant is formed between the inner tube and the outer tube. The circulation path is formed by inner and outer tubes that are separate from the coated wire, and the coated wire is disposed radially inward of the circulation path.

SUMMARY

Incidentally, in the wire harness disclosed in JP 2019-115253A, the circulation path (a path along which the coolant flows) is disposed outside the coated wire, and thus the coolant is far from the central portion of the coated wire, which is the heat source. Accordingly, there is room for improvement in terms of cooling efficiency of the coated wire.

An exemplary aspect of the disclosure provides a wire harness unit capable of improving cooling efficiency.

A wire harness unit that is an aspect of the present disclosure includes a plurality of conductive paths for conducting electricity between in-vehicle devices; and a cooling tube through which a coolant is able to flow for cooling the plurality of conductive paths, wherein: the plurality of conductive paths include a first conductive path and a second conductive path parallel to the first conductive path, the first conductive path includes a first inner insulating layer that is hollow and tubular, and a first tubular conductor that covers an outer circumferential surface of the first inner insulating layer, the second conductive path includes a second inner insulating layer that is hollow and tubular, and a second tubular conductor that covers an outer circumferential surface of the second inner insulating layer, the cooling tube is separate from the first inner insulating layer and the second inner insulating layer, and the cooling tube includes a first section extending through the first inner insulating layer, a second section extending through the second inner insulating layer, and a turnback portion that links the first section and the second section.

According to a wire harness unit that is an aspect of the present disclosure, cooling efficiency can be improved.

DETAILED DESCRIPTION OF EMBODIMENTS

Description of Embodiments of Disclosure

First, aspects of the present disclosure will be listed and described.

[1] A wire harness unit according to the present includes a plurality of conductive paths for conducting electricity between in-vehicle devices, and a cooling portion for cooling the plurality of conductive paths, the plurality of conductive paths include a first conductive path and a second conductive path that is parallel with the first conductive path, the first conductive path includes a first inner insulating layer that is hollow and tubular, and a first tubular conductor that covers an outer circumferential surface of the first inner insulating layer, the second conductive path includes a second inner insulating layer that is hollow and tubular, and a second tubular conductor that covers an outer circumferential surface of the second inner insulating layer, the cooling portion includes a cooling tube through which a coolant is able to flow and that is separate from the first inner insulating layer and the second inner insulating layer, and the cooling tube includes a first section extending through the first inner insulating layer, a second section extending through the second inner insulating layer, and a turnback portion that links the first section and the second section.

According to this configuration, as a result of the first section of the cooling tube extending through the first inner insulating layer, and the second section extending through the second inner insulating layer, the coolant can flow inside the first tubular conductor and the second tubular conductor. For this reason, the first tubular conductor and the second tubular conductor can be cooled from the inside, thereby making it possible to improve cooling efficiency. Moreover, since the cooling tube includes the turnback portion that links the first section and the second section, it is possible to reduce the number of inlets and outlets for the coolant, and simplify the structure for connection to a pump, for example, compared with a case where the cooling tube does not include the turnback portion and a cooling tube is provided for each conductive path. In addition, for example, it is possible to reduce the number of cooling tubes and the number of components compared with a case where the cooling tube does not include the turnback portion and a cooling tube is provided for each conductive path.

[2] It is preferable that the number of conductive paths included in the plurality of conductive paths is an even number.

According to this configuration, since the number of conductive paths included in the plurality of conductive paths is an even number, the inlet and the outlet for the coolant can be easily positioned close to each other. That is to say, a situation is avoided where the positions of the inlet and the outlet for the coolant are spaced far apart from each other when, for example, the number of conductive paths is three, which is an odd number, and the cooling tube further includes a third section extending through a third inner insulating layer of a third conductive path, and a turnback portion that links the second section and the third section. Thus, it is possible to easily set the positions of the inlet and the outlet for the coolant close to each other, and to reduce a routing space and the like for connection to a pump, for example.

[3] It is preferable that the wire harness unit further includes an exterior member for covering the conductive paths, the exterior member includes a tubular exterior member and a grommet that is connected to an end portion of the tubular exterior member, and the turnback portion is disposed inside the grommet.

According to this configuration, since the turnback portion is disposed inside the grommet, it is possible to easily house the turnback portion, for example. Even in a case where, for example, the turnback portion is configured such that it cannot be sharply bent, and a large space is required, such a case can be easily addressed without increasing the entire size of the tubular exterior member. Moreover, for example, if the grommet is shaped such that the size thereof increases toward a member that is connected to the grommet, the turnback portion can be easily housed in a large space.

[4] It is preferable that the first tubular conductor is a first braided member formed by braiding metal strands, and the second tubular conductor is a second braided member formed by braiding metal strands.

According to this configuration, the first tubular conductor is a first braided member formed by braiding metal strands, and the second tubular conductor is a second braided member formed by braiding metal strands, and the first tubular conductor and the second tubular conductor are flexible, thus making it possible to absorb dimensional tolerance of the conductive paths. Further, this configuration is a counter measure against swinging generated while a vehicle is travelling.

[5] It is preferable that the wire harness unit further includes an electromagnetic shield member for covering the cooling tube and the conductive paths, the electromagnetic shield member is a shielding braided member formed by braiding metal strands, the first inner insulating layer and the second inner insulating layer each include an exposed insulating portion that is exposed from the first tubular conductor or the second tubular conductor, the exposed insulating portion covers the cooling tube, and the cooling tube extends through the shielding braided member.

According to this configuration, both the shielding properties for suppressing electromagnetic noise radiation from the conductive paths and an improvement in the ease of assembly of the cooling portion can be achieved. In addition, the exposed insulating portions of the first inner insulating layer and the second inner insulating layer make it possible to keep the cooling tube from coming into contact with the first tubular conductor and the second tubular conductor.

[6] It is preferable that the wire harness unit further includes an electromagnetic shield member for covering the cooling tube and the conductive paths, the electromagnetic shield member is a shielding braided member formed by braiding metal strands, the first inner insulating layer and the second inner insulating layer each include an exposed insulating portion that is exposed from the first tubular conductor or the second tubular conductor, the exposed insulating portion covers the cooling tube, and the exposed insulating portion and the cooling tube extend through the shielding braided member.

According to this configuration, both the shielding properties for suppressing electromagnetic noise radiation from the conductive paths and an improvement in the ease of assembly of the cooling portion can be achieved. In addition, the exposed insulating portions of the first inner insulating layer and the second inner insulating layer make it possible to keep the cooling tube from coming into contact with first tubular conductor, the second tubular conductor, and the electromagnetic shield member that is a shielding braided member.

[7] It is preferable that the first conductive path and the second conductive path each include a terminal and an outer insulating layer for covering an outer circumferential surface of the first tubular conductor or the second tubular conductor, the first tubular conductor and the second tubular conductor each include an exposed conductor portion that is exposed from the outer insulating layer, the exposed conductor portion is electrically connected to the terminal, and the exposed conductor portion is covered by the electromagnetic shield member.

According to this configuration, both the shielding properties for suppressing electromagnetic noise radiation from the conductive paths and an improvement in the ease of assembly of the cooling portion can be achieved.

[8] It is preferable that the wire harness unit further includes a coating member for covering the exposed conductor portion.

According to this configuration, it is possible to prevent the exposed conductor portions of the first tubular conductor and the second tubular conductor from coming into contact with the electromagnetic shield member.

[9] It is preferable that the wire harness unit further includes an exterior member for covering the conductive paths, and the exterior member includes a tubular exterior member and a grommet connected to an end portion of the tubular exterior member, and the cooling tube extends through the grommet.

According to this configuration, since the cooling tube extends through the grommet and is led out to the outside, a decrease in the water blocking properties of the wire harness unit can be suppressed.

DESCRIPTION OF EMBODIMENTS OF DISCLOSURE

Specific examples of a wire harness unit according to the present disclosure will be described below with reference to the drawings. Note that in the drawings, parts of the configurations may be shown in an exaggerated or simplified manner for convenience of description. Moreover, dimensional ratios of various portions may be different from actual dimensional ratios. "Parallel" and "orthogonal" in the present specification include not only being exactly parallel and orthogonal but also approximately parallel and orthogonal within a range in which the operation and effects of the present embodiment can be achieved. The present disclosure is not limited to the embodiments disclosed herein, but is defined by the claims, and intended to include all modifications within the meaning and the scope equivalent thereof Overview Configuration of Wire Harness Unit 10

Figure 1:
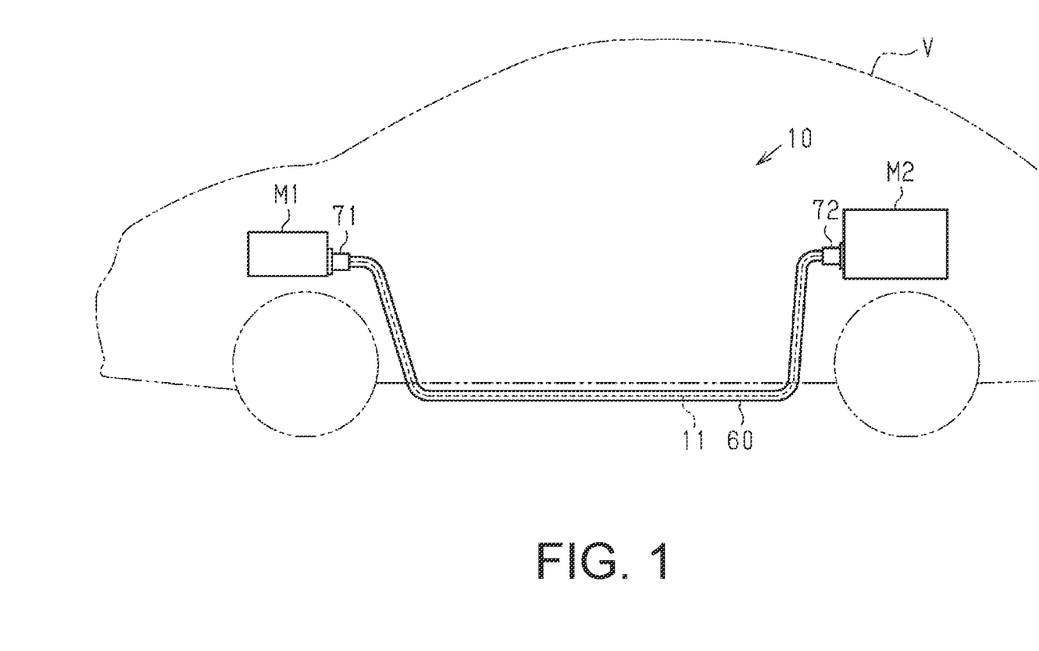
FIG. 1 is a schematic diagram showing a vehicle in which a wire harness unit according to an embodiment is routed.

A wire harness unit 10 shown in FIG. 1 electrically connects two in-vehicle devices installed in a vehicle V. The vehicle V is, for example, a hybrid car, an electric car, or the like. The wire harness unit 10 includes conductive paths 11 for electrically connecting an in-vehicle device M1 and an in-vehicle device M2, and an exterior member 60 (exterior cover) for covering the conductive paths 11. The conductive paths 11 are routed, for example, from the in-vehicle device M1 to the in-vehicle device M2 so that portions thereof in a lengthwise direction pass under the floor of the vehicle V.

With regard to examples of the in-vehicle device M1 and the in-vehicle device M2, the in-vehicle device M1 is an inverter installed toward the front side of the vehicle V, and the in-vehicle device M2 is a high-voltage battery installed on the rear side of the vehicle V relative to the in-vehicle device M1. The in-vehicle device M1 serving as an inverter is connected to a motor (not shown) for driving the wheels serving as a motive power source for causing the vehicle to travel, for example. The inverter generates AC power from DC power from the high-voltage battery, and supplies the AC power to the motor. The in-vehicle device M2, which is a high-voltage battery, is a battery capable of supplying a voltage of at least 100 V, for example. In other words, the conductive paths 11 of the present embodiment constitute a high-voltage circuit that enables high-voltage exchange between the high-voltage battery and the inverter.

Detailed Configuration of Wire Harness Unit 10

Figure 2:
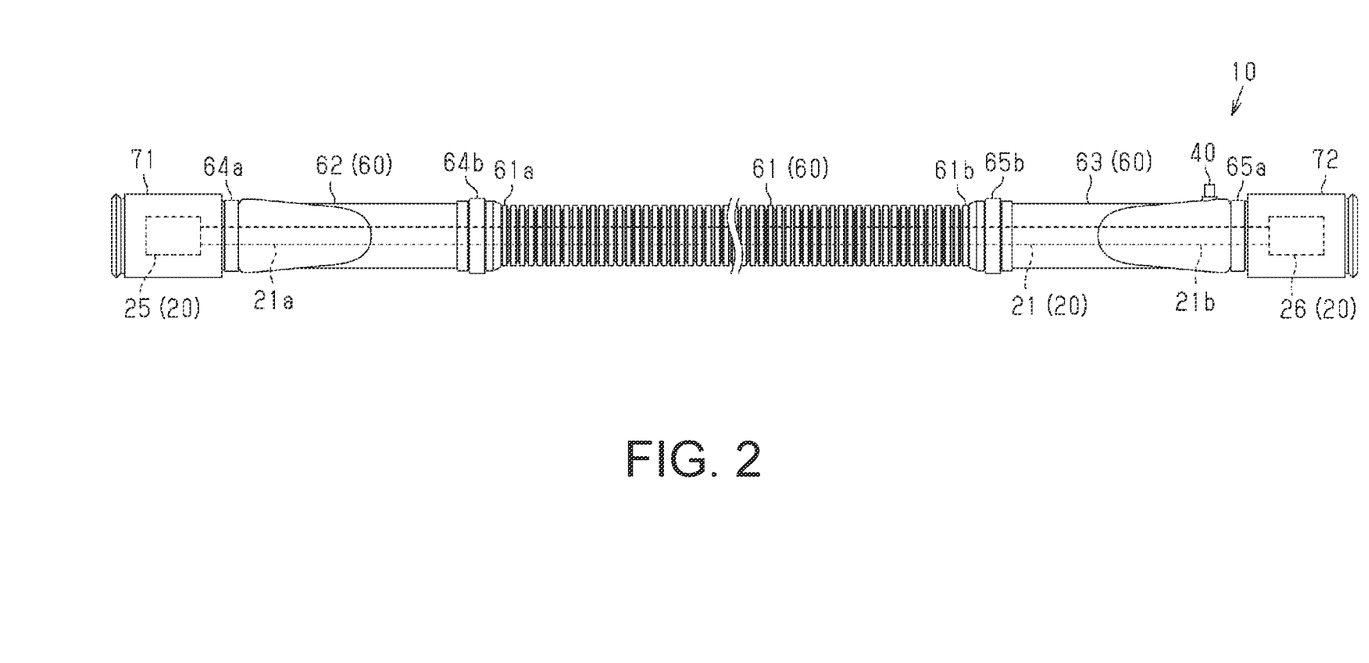
FIG. 2 is a schematic diagram of the wire harness unit.
Figure 3:
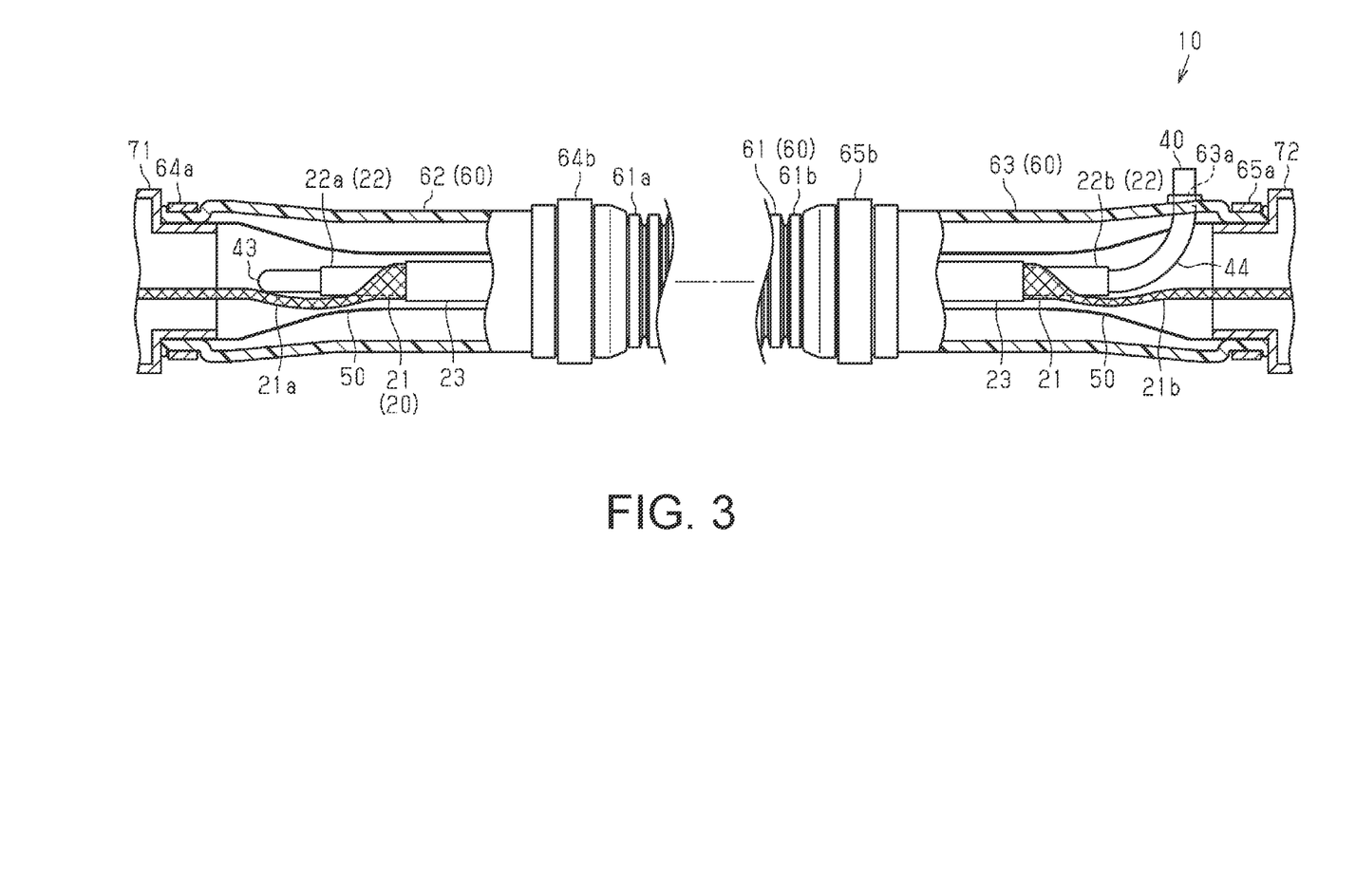
FIG. 3 is a partial cross sectional view showing an overview of the wire harness unit.
Figure 4:
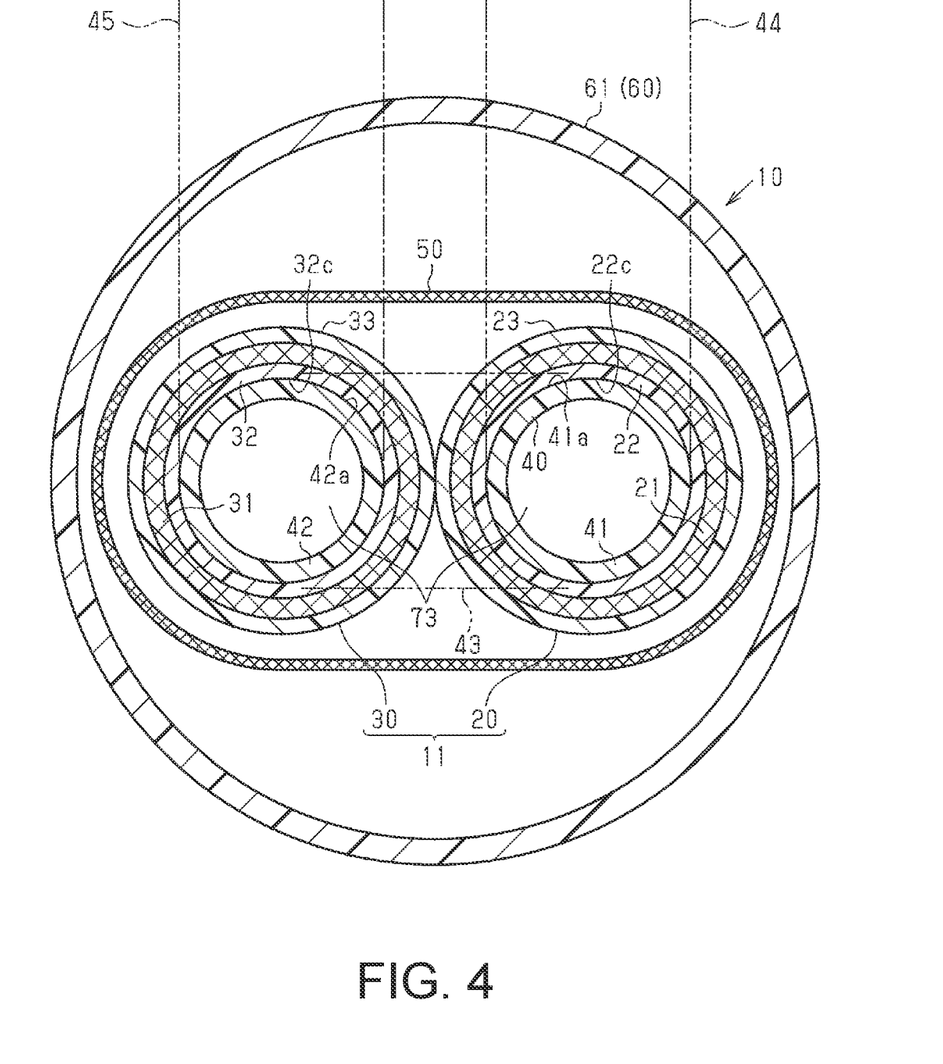
FIG. 4 is a cross sectional view of the wire harness unit.
Figure 6:
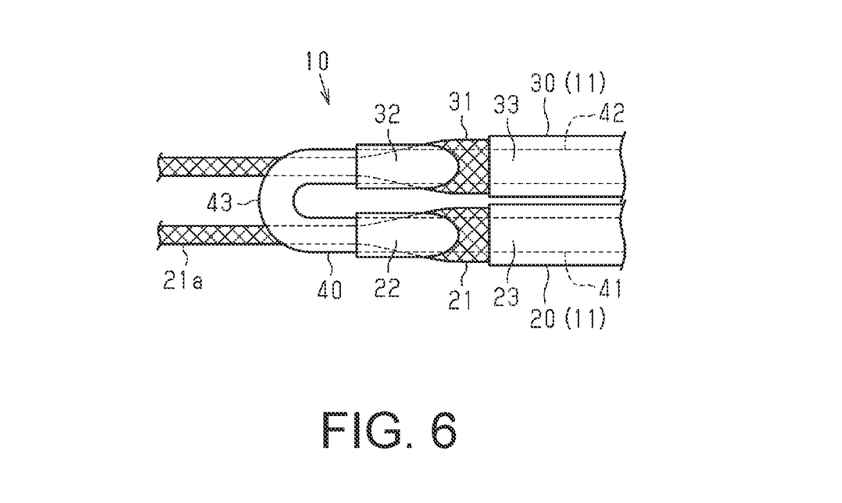
FIG. 6 is a schematic diagram showing a portion of the wire harness unit.

As shown in FIGS. 2, 3, and 4, the wire harness unit 10 includes a plurality of conductive paths 11, a cooling tube 40, an electromagnetic shield member 50 (electromagnetic shield), an exterior member 60, and connectors 71 and 72. As shown in FIGS. 4 and 6, the plurality of conductive paths 11 include a first conductive path 20 and a second conductive path 30 that is parallel with the first conductive path 20.

As shown in FIGS. 3 to 6, the first conductive path 20 includes a first tubular conductor 21, a first inner insulating layer 22, an outer insulating layer 23, and terminals 25 and 26.

The first tubular conductor 21 is conductive and has a hollow structure. The first tubular conductor 21 is a first braided member formed by braiding metal strands, for example. A plating layer of tin or the like may be formed on the surfaces of the metal strands. The material for the first tubular conductor 21 is a metal material such as a copper-based material or an aluminum-based material. The first tubular conductor 21 is formed in a shape conforming to a routing path of the wire harness unit 10 shown in FIG. 1. The first tubular conductor 21 is bent using a pipe bender (in other words, a pipe bending device).

FIG. 4 is a cross-sectional view of the wire harness unit 10 taken along a plane orthogonal to the lengthwise direction of the wire harness unit 10. In FIG. 4, the lengthwise direction of the first tubular conductor 21 is the front-back direction of the sheet plane of FIG. 4. The cross-sectional shape of the first tubular conductor 21 taken along a plane that is vertical to the lengthwise direction of the first tubular conductor 21, that is, a direction in which the first tubular conductor 21 extends and that is the axial direction of the first tubular conductor 21 (i.e., a lateral cross-sectional shape) is annular, for example. Note that, the cross sectional shape of the first tubular conductor 21 can be any shape. Also, with respect to the cross sectional shape of the first tubular conductor 21, the shapes of the outer circumference and the inner circumference may be different from each other. Also, cross sectional shapes of the first tubular conductor 21 in the lengthwise direction may be different from each other.

The first inner insulating layer 22 has a hollow structure, and is flexible. Also, the first inner insulating layer 22 is insulative. The outer circumferential surface of the first inner insulating layer 22 is covered by the first tubular conductor 21. The first inner insulating layer 22 is constituted by an insulating material such as a synthetic resin. Examples of the material for the first inner insulating layer 22 include a silicone resin, a synthetic resin whose main component is a polyolefin resin such as cross-linked polyethylene or cross-linked polypropylene, and the like. A single kind of material, or two or more kinds of materials can be used in combination as appropriate, for the first inner insulating layer 22. The first inner insulating layer 22 can be formed by performing extrusion molding (extrusion coating) on the first tubular conductor 21, for example.

The outer insulating layer 23 covers the entirety of the outer circumferential surface of the first tubular conductor 21 in the circumferential direction, for example. The outer insulating layer 23 is flexible. Also, the outer insulating layer 23 is insulative. The outer insulating layer 23 is constituted by an insulating material such as a synthetic resin. Examples of the material for the outer insulating layer 23 include a silicone resin, a synthetic resin whose main component is a polyolefin resin such as cross-linked polyethylene or cross-linked polypropylene, and the like. A single kind of material, or two or more kinds of materials can be used in combination as appropriate, for the outer insulating layer 23. The outer insulating layer 23 can be formed by performing extrusion molding (extrusion coating) on the first tubular conductor 21, for example.

As shown in FIG. 3, the first inner insulating layer 22 includes exposed insulating portions 22a and 22b exposed from the first tubular conductor 21, at the two ends in the lengthwise direction of the first inner insulating layer 22. The exposed insulating portions 22a and 22b cover the cooling tube 40.

As shown in FIG. 3, the first tubular conductor 21 includes exposed conductor portions 21a and 21b that are exposed from the outer insulating layer 23, at the two ends in the lengthwise direction of the first tubular conductor 21.

As shown in FIG. 3, the exposed conductor portion 21a extends to the connector 71. The exposed conductor portion 21b extends to the connector 72.

Figure 5:
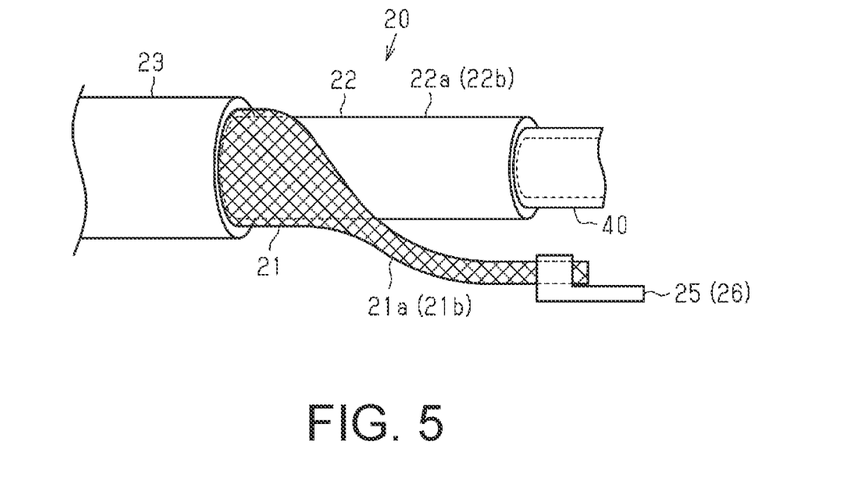
FIG. 5 is a diagram illustrating connection between a tubular conductor, a flexible conductor, and a terminal.

FIG. 5 is an illustrative diagram showing connection between the first tubular conductor and the terminals. Note that, in FIG. 5, the members of the first conductive path 20 shown on the left side of FIGS. 2 and 3 are indicated by reference signs without parentheses, and the members shown on the right side of FIGS. 2 and 3 are indicated by reference signs in parentheses.

The terminal 25 is held by the connector 71 shown in FIGS. 1 and 2, and connected to the in-vehicle device M1. The terminal 25 is connected to a leading end of the exposed conductor portion 21a of the first tubular conductor 21. For example, the terminal 25 includes a pair of crimping pieces, with which the terminal 25 is crimped to the leading end of the exposed conductor portion 21a. The terminal 26 is held by the connector 72 shown in FIGS. 1 and 2, and connected to the in-vehicle device M2. The terminal 26 is connected to a leading end of the exposed conductor portion 21b of the first tubular conductor 21. For example, the terminal 26 includes a pair of crimping pieces, with which the terminal 26 is crimped to the leading end of the exposed conductor portion 21b.

In addition, the second conductive path 30 includes a second tubular conductor 31, a second inner insulating layer 32, an outer insulating layer 33, and terminals 25 and 26. As shown in FIGS. 4 and 6, the second conductive path 30 is parallel with the first conductive path 20. The second conductive path 30 is configured in a similar manner to the first conductive path 20, and, for example, the second tubular conductor 31 is a second braided member formed by braiding metal strands similarly to the first tubular conductor 21, for example, and is a component having the same model number as the first tubular conductor 21. Also, the second inner insulating layer 32 is configured in a similar manner to the first inner insulating layer 22. In this manner, similar names and reference numerals are given to the constituent components of the second conductive path 30 that are similar to the constituent components of the first conductive path 20, and a detailed description thereof is omitted.

As shown in FIGS. 3, 4, and 6, the cooling tube 40 is hollow. The cooling tube 40 includes a first section 41 that extends through the first inner insulating layer 22, a second section 42 that extends through the second inner insulating layer 32, and a turnback portion 43 that links the first section 41 and the second section 42.

As shown in FIG. 4, in the present embodiment, an outer circumferential surface 41a of the first section 41 is in contact with an inner circumferential surface 22c of the first inner insulating layer 22. An outer circumferential surface 42a of the second section 42 is in contact with an inner circumferential surface 32c of the second inner insulating layer 32. Note that an adhesive or a resin material such as a pressure-sensitive adhesive may be interposed between the outer circumferential surface 41a of the first section 41 and the inner circumferential surface 22c of the first inner insulating layer 22. In addition, an adhesive or a resin material such as a pressure-sensitive adhesive may be interposed between the outer circumferential surface 42a of the second section 42 and the inner circumferential surface 32c of the second inner insulating layer 32. A material that has excellent heat conductivity can be used as an interposing resin material. As shown in FIG. 6, the turnback portion 43 of the cooling tube 40 is formed to protrude from the first inner insulating layer 22 and the second inner insulating layer 32 to the outside, and be folded so as to link the first section 41 and the second section 42. The material for the cooling tube 40 is a flexible resin material such as PP (polypropylene), PVC (polyvinyl chloride), or cross-linked PE (polyethylene resin).

A coolant 73 is supplied to the inside of the cooling tube 40. The coolant 73 may be a liquid such as water and an antifreeze solution, or a fluid such as a gas, or an air-liquid two-phase flow in which a gas and a liquid are mixed. The coolant 73 is supplied by a pump (not shown). The cooling tube 40 forms a part of a circulation path through which the coolant 73 is circulated. The circulation path includes the above-described pump and a heat dissipating portion, for example. The pump pressurizes and feeds the coolant 73 to the cooling tube 40. The coolant 73 supplied to the cooling tube 40 performs heat-exchange with the first tubular conductor 21 and the second tubular conductor 31 disposed outside of the cooling tube 40. The heat dissipating portion cools the coolant 73 by dissipating heat from the coolant 73, of which the temperature has risen as a result of heat exchange, to the outside. The cooled coolant 73 is pressurized and fed again to the cooling tube 40 by the pump. The cooling tube 40 constitutes a cooling portion for cooling the first tubular conductor 21 and the second tubular conductor 31 using the coolant 73 circulated in this manner.

As shown in FIGS. 3 and 4, the electromagnetic shield member 50 covers two conductive paths 11. The electromagnetic shield member 50 is a shielding braided member formed by braiding metal strands into a tubular shape. The electromagnetic shield member 50 has shielding properties. Also, the electromagnetic shield member 50 is flexible. As shown in FIG. 3, one end of the electromagnetic shield member 50 is connected to the connector 71, and the other end of the electromagnetic shield member 50 is connected to the connector 72. Accordingly, the electromagnetic shield member 50 covers the entire length of the conductive paths 11 that transmit a high voltage. In this manner, the radiation of electromagnetic noise originating from the conductive paths 11 to the outside is suppressed.

The exterior member 60 covers the conductive paths 11 and the electromagnetic shield member 50. The above-described cooling tube 40 extends through the first inner insulating layer 22 and the second inner insulating layer 32 of the conductive paths 11. The first inner insulating layer 22 is covered by the first tubular conductor 21. Therefore, it can also be said that the cooling tube 40 extends through the first tubular conductor 21. The second inner insulating layer 32 is covered by the second tubular conductor 31. Thus, it can also be said that the cooling tube 40 extends through the second tubular conductor 31. Moreover, the exterior member 60 covers the conductive paths 11 and the electromagnetic shield member 50, and at least a portion of the cooling tube 40.

The exterior member 60 includes a tubular exterior member 61 (exterior tube), and grommets 62 and 63 respectively connected to a first end portion 61a and a second end portion 61b of the tubular exterior member 61.

The tubular exterior member 61 covers portions of the outer circumferences of the first tubular conductor 21 and the second tubular conductor 31 in the lengthwise direction, for example. The tubular exterior member 61 is formed in a tubular shape in which the two ends thereof in the lengthwise direction of the first tubular conductor 21 and the second tubular conductor 31 are open, for example. The tubular exterior member 61 surrounds the entirety of the outer circumferences of the first tubular conductor 21 and the second tubular conductor 31 in the circumferential direction, for example. The tubular exterior member 61 of the present embodiment is formed in a cylindrical shape. The tubular exterior member 61 has a bellows structure in which, for example, annular protruding portions and annular recessed portions are alternately arranged along the axis direction (lengthwise direction) thereof in which the central axial line of the tubular exterior member 61 extends. Examples of the material for the tubular exterior member 61 include a conductive resin material and a non-conductive resin material. Examples of the resin material include a synthetic resin such as polyolefin, polyamide, polyester, and ABS resin. The tubular exterior member 61 of the present embodiment is a corrugated tube made of a synthetic resin.

The grommet 62 is formed in a substantially tubular shape. The grommet 62 is made of rubber, for example. The grommet 62 spans between the connector 71 and the tubular exterior member 61. The grommet 62 is fastened and fixed to the outer surface of the connector 71 by a fastening band 64a so as to be in close contact therewith. Also, the grommet 62 is fastened and fixed to the outer side of the first end portion 61a of the tubular exterior member 61 by a fastening band 64b so as to be in close contact therewith. As shown in FIG. 3, the turnback portion 43 of the cooling tube 40 is disposed inside the grommet 62.

The grommet 63 is formed in a substantially tubular shape. The grommet 63 is made of rubber, for example. The grommet 63 spans between the connector 72 and the tubular exterior member 61. The grommet 63 is fastened and fixed to the outer surface of the connector 72 by a fastening band 65a so as to be in close contact therewith. Also, the grommet 63 is fastened and fixed to the outer side of the second end portion 61b of the tubular exterior member 61 by a fastening band 65b so as to be in close contact therewith. Through holes 63a extending through the grommet 63 are formed in the grommet 63. The through holes 63a bring the inside and the outside of the grommet 63 into communication.

In the present embodiment, the two through holes 63a are formed in the grommet 63, and the cooling tube 40 is passed through the through holes 63a. Specifically, as shown in FIG. 4, the cooling tube 40 includes an inlet portion 44 extending from the first section 41 and an outlet portion 45 extending from the second section 42, on the opposite side to the turnback portion 43. The through holes 63a come in close contact with the outer circumferential surfaces of the inlet portion 44 and the outlet portion 45 which are respectively passed through the through holes 63a. As shown in FIG. 3, the inlet portion 44 extends through the electromagnetic shield member 50, and is led from the through hole 63a of the grommet 63 to the outside of the grommet 63. Similarly to the inlet portion 44, the outlet portion 45 extends through the electromagnetic shield member 50, and is led out from the through hole 63a of the grommet 63 to the outside of the grommet 63. The inlet portion 44 constitutes an inlet for the coolant 73 in the cooling tube 40. The outlet portion 45 constitutes an outlet for the coolant 73 in the cooling tube 40. The inlet portion 44 and the outlet portion 45 are connected to the pump.

Operation

Next, operation of the wire harness unit 10 of the present embodiment will be described.

The wire harness unit 10 includes the conductive paths 11 that conduct electricity between the in-vehicle devices M1 and M2, and the cooling tube 40 constituting the cooling portion that cools the conductive paths 11. The first conductive path 20 includes the first tubular conductor 21 that is conductive and hollow, and the first inner insulating layer 22 covered by the first tubular conductor 21. The second conductive path 30 includes the second tubular conductor 31 that is conductive and hollow, and the second inner insulating layer 32 covered by the second tubular conductor 31. The coolant 73 can flow inside the cooling tube 40, which is separated from the first inner insulating layer 22 and the second inner insulating layer 32. In addition, the cooling tube 40 includes the first section 41 extending through the first inner insulating layer 22, the second section 42 extending through the second inner insulating layer 32, and the turnback portion 43 that links the first section 41 and the second section 42.

The coolant 73 is supplied to the cooling tube 40. At this time, the coolant 73 flows through the inlet portion 44, the first section 41, the turnback portion 43, the second section 42, and the outlet portion 45 of the cooling tube 40 in the stated order. The first inner insulating layer 22 through which the first section 41 extends is covered by the first tubular conductor 21. The second inner insulating layer 32 through which the second section 42 extends is covered by the second tubular conductor 31. Therefore, the cooling tube 40 allows the coolant 73 to flow inside the first tubular conductor 21 and the second tubular conductor 31. For this reason, the first tubular conductor 21 and the second tubular conductor 31 are cooled through heat exchange between the coolant 73 flowing through the cooling tube 40 and the first tubular conductor 21 and the second tubular conductor 31. In this manner, it is possible to cool the first tubular conductor 21 and the second tubular conductor 31 from the inside.

Compared to a braided wire formed by twisting together a plurality of metal strands having the same cross sectional area and a single core wire having a solid structure, the first tubular conductor 21 and the second tubular conductor 31 have a larger outer circumference. In other words, the first tubular conductor 21 and the second tubular conductor 31 have a larger area on the outer circumferential side compared to a braided wire and a single core wire. Accordingly, since heat can be dissipated outward from a larger area, heat dissipation properties can be improved.

The first tubular conductor 21 of the first conductive path 20 is a first braided member formed by braiding metal strands, and includes the exposed conductor portions 21a and 21b that are exposed from the outer insulating layer 23. Leading ends of the exposed conductor portions 21a and 21b are respectively connected to the terminals 25 and 26 fixed to the connectors 71 and 72. The exposed conductor portions 21a and 21b are more flexible than the outer insulating layer 23. Accordingly, dimensional tolerance of the first conductive path 20 can be absorbed. Also, when the vehicle V vibrates, positional deviation between the parts due to the vibration can be absorbed. Accordingly, loads applied to the connectors 71 and 72 and the terminals 25 and 26 can be reduced. In addition, the second conductive path 30 has a configuration similar to the first conductive path 20, and thus has similar operation and effects.

The electromagnetic shield member 50 covers the two conductive paths 11. The electromagnetic shield member 50 is a shielding braided member formed by braiding metal strands into a tubular shape. For this reason, it is possible to suppress electromagnetic noise radiation from the conductive paths 11 to the outside. In addition, for this reason, the cooling tube 40 can be led out from the electromagnetic shield member 50, at an intermediate portion of the electromagnetic shield member 50. Accordingly, the cooling tube 40 can be easily led to the outside of the wire harness unit 10, and constituent members for circulating the coolant 73 can be easily connected to the cooling tube 40.

The wire harness unit 10 includes the exterior member 60 for covering at least a portion of the cooling tube 40 and the conductive paths 11. The exterior member 60 includes a tubular exterior member 61, and grommets 62 and 63 respectively connected to a first end portion 61a and a second end portion 61b of the tubular exterior member 61. The cooling tube 40 extends through the grommet 63. In this manner, since the cooling tube 40 extends through the grommet 63 so as to be led to the outside of the wire harness unit 10, degradation of the water blocking properties of the wire harness unit 10 can be suppressed.

As described above, according to the present embodiment, the following effects are achieved.

(1) As a result of the first section 41 of the cooling tube 40 extending through the first inner insulating layer 22 and the second section 42 extending through the second inner insulating layer 32, the coolant 73 can flow inside the first tubular conductor 21 and the second tubular conductor 31. For this reason, the first tubular conductor 21 and the second tubular conductor 31 can be cooled from the inside, making it possible to improve the cooling efficiency. Moreover, the cooling tube 40 includes the turnback portion 43 that links the first section 41 and the second section 42, and thus, for example, compared with a case where the cooling tube 40 does not include the turnback portion 43 and the cooling tube 40 is provided for each of the conductive paths 11, it is possible to reduce the number of inlets and outlets for the coolant 73, specifically, the number of inlet portions 44 and outlet portions 45 of the cooling tube 40. Thus, a connection structure for connection between the cooling tube 40 and the pump can be simplified. In addition, for example, compared with a case where the cooling tube 40 does not include the turnback portion 43 and is provided for each of the conductive paths 11, it is possible to reduce the number of cooling tubes 40 and the number of components.

(2) The plurality of conductive paths 11 include the first conductive path 20 and the second conductive path 30. The number of conductive paths included in the plurality of conductive paths 11 is an even number, and thus the inlet and the outlet for the coolant 73, specifically, the inlet portion 44 and the outlet portion 45 can be naturally positioned on the same side, and the inlet and the outlet for the coolant can be easily positioned close to each other. That is to say, a situation is avoided where the positions of the inlet and the outlet for the coolant 73 are spaced far apart from each other when, for example, the number of conductive paths 11 is three, which is an odd number, and the cooling tube 40 further includes a third section extending through a third inner insulating layer of a third conductive path, and a turnback portion that links the second section and the third section. Thus, for example, it is possible to easily set the positions of the inlet portion 44 and the outlet portion 45 of the cooling tube 40 close to each other, and to reduce a routing space and the like for connection to a pump, for example.

(3) The turnback portion 43 is disposed inside the grommet 62, and thus, for example, the turnback portion 43 can be easily housed. Even in a case where, for example, the turnback portion 43 is configured such that it cannot be sharply bent, and a large space is required, such a case can be easily addressed without increasing the entire size of the tubular exterior member 61. Moreover, for example, if the grommet 62 is shaped such that the size thereof increases toward a member that is connected thereto, the turnback portion 43 can be easily housed in a large space.

(4) The first tubular conductor 21 is a first braided member formed by braiding metal strands, and the second tubular conductor 31 is a second braided member formed by braiding metal strands, and the first tubular conductor 21 and the second tubular conductor 31 are flexible, thus making it possible to absorb dimensional tolerance of the conductive paths 11. Further, this configuration is a counter measure against swinging generated while a vehicle is travelling.

(5) The electromagnetic shield member 50 is a shielding braided member formed by braiding metal strands into a tubular shape, and the cooling tube 40, specifically the inlet portion 44 and the outlet portion 45, extend through the shielding braided member, and thus both the shielding properties for suppressing radiation of electromagnetic noise originating from the conductive paths 11 to the outside and an improvement in the ease of assembly of the cooling portion can be achieved. In addition, the first inner insulating layer 22 and the second inner insulating layer 32 include the exposed insulating portions 22a and 22b that are exposed from the first tubular conductor 21 and the second tubular conductor 31, and cover the cooling tube 40, and thus it is possible to keep the cooling tube 40 from coming into contact with the first tubular conductor 21 and the second tubular conductor 31.

(6) Since the cooling tube 40, specifically the inlet portion 44 and the outlet portion 45, extend through the grommet 63 so as to be led to the outside, degradation of the water blocking properties of the wire harness unit 10 can be suppressed.

Variations

The present embodiment can be modified and implemented as follows. The present embodiment and the variations below may be implemented in combination with each other as long as no technical contradictions arise.

In the above embodiment, the number of conductive paths included in the plurality of conductive paths 11 is an even number, but there is no limitation thereto, and the number of conductive paths may be an odd number of three or more, or may be an even number of four or more. A configuration may be adopted in which, for example, the number of conductive paths 11 is three, and the cooling tube 40 further includes a third section extending through a third tubular conductor on a third conductive path, and a turnback portion that links the second section and the third section. Moreover, a configuration may also be adopted in which, for example, the number of conductive paths 11 is four, for example, and the cooling tube 40 further includes a third section extending through a third tubular conductor on a third conductive path, a turnback portion that links the second section and the third section, a fourth section extending through a fourth tubular conductor on a fourth conductive path, and a turnback portion that links the third section and the fourth section.

In the above embodiment, the turnback portion 43 is configured to be disposed inside the grommet 62, but there is no limitation thereto, and the turnback portion 43 may be configured to be disposed at another location such as inside the tubular exterior member 61.

In the above embodiment, the cooling tube 40 is led out from the grommet 63, that is, the cooling tube 40 is passed through grommet 63. However, the cooling tube 40 may be led out from the connector 72. By doing so, the first tubular conductor 21, the second tubular conductor 31, and the connector 72 can be cooled.

The electromagnetic shield member 50 of the above embodiment may be a piece of metal tape or the like. An insulation layer may be provided on the inner circumferential surface of the electromagnetic shield member 50.

Figure 7:
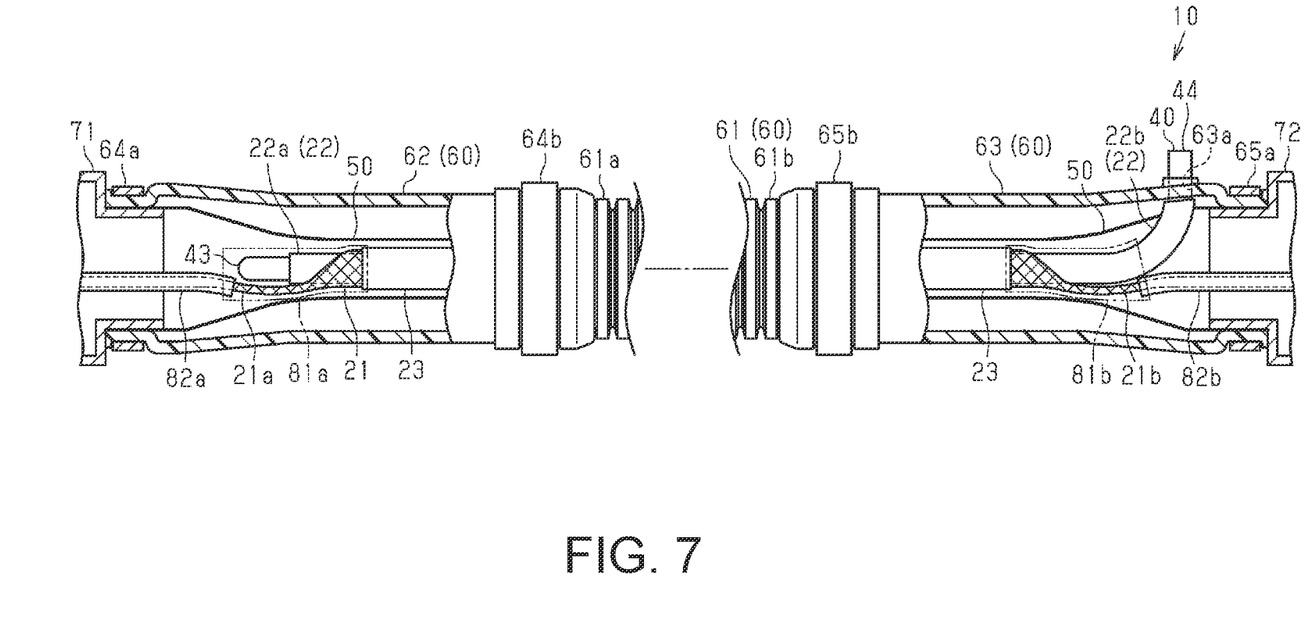
FIG. 7 is a partial cross-sectional view showing an overview of a wire harness unit according to a variation.
Figure 8:
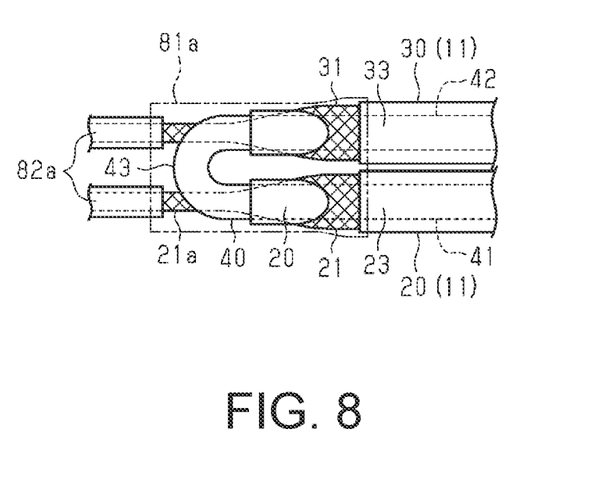
FIG. 8 is a schematic diagram showing a portion of the wire harness unit according to the variation.

As shown in FIGS. 7 and 8, a configuration may be adopted in which coating members 81a and 81b (coats) that cover the exposed conductor portions 21a and 21b of the first tubular conductor 21 and the second tubular conductor 31 are provided. The coating members 81a and 81b are insulative, and prevent the exposed conductor portions 21a and 21b from coming into contact with the electromagnetic shield member 50. The coating members 81a and 81b are heat-shrinkable tubes, for example. In addition, a configuration may also be adopted in which coating members 82a and 82b that cover the exposed conductor portions 21a and 21b extending to the connectors 71 and 72 are provided. The coating members 82a and 82b are heat-shrinkable tubes, for example. Preferably, the coating members 82a and 82b respectively cover as far as the terminals 25 and 26 shown in FIG. 5.

As shown in FIG. 7, a configuration may be adopted in which the first inner insulating layer 22, specifically the exposed insulating portion 22b thereof covers the cooling tube 40, and extends through the electromagnetic shield member 50. In this case, the first inner insulating layer 22 makes it possible to prevent the electromagnetic shield member 50 and the cooling tube 40 from coming into contact with each other. In addition, as a matter of course, the second inner insulating layer 32 may be configured in a similar manner.

As shown in FIGS. 3, 5, and 6, the first tubular conductor 21 according to an embodiment can have first and second length portions corresponding to the exposed conductor portions 21a and 21b at the two ends thereof, and a third length portion spanning the entire length of the first tubular conductor 21 excluding the two exposed conductor portions 21a and 21b, the third length portion being sandwiched between the outer insulating layer 23 and the first inner insulating layer 22. The first and second length portions corresponding_ to the exposed conductor portions 21a and 21b do not need to be sandwiched between the outer insulating layer 23 and the first inner insulating layer 22, and may be led out from the outer insulating layer 23 and/or the first inner insulating layer 22 outward in a radial direction. If the first tubular conductor 21 is a tube made of braided wires, the exposed conductor portion 21a may be a tubular, belt-like, or linear braided wire lead formed by reducing the diameter of, transforming, or processing a tube made of braided wires that forms the first tubular conductor 21. The same applies to the second tubular conductor 31.

As shown in FIGS. 3 and 6, the wire harness unit 10 according to a preferable example can include a first tubular insulator corresponding to the first inner insulating layer 22, a second tubular insulator corresponding to the second inner insulating layer 32, a first metal braided conductor corresponding to the first tubular conductor 21, a second metal braided conductor corresponding to the second tubular conductor 31, the cooling tube 40, and the electromagnetic shield member 50. The first and second tubular insulators each may have a first opening end, a second opening end, and a pipe length defined by the first opening end and the second opening end. The cooling tube 40 may have a tube length that is longer than the total of the pipe length of the first tubular insulator and the pipe length of the second tubular insulator. The cooling tube 40 may have a first intermediate length portion that is housed in the first tubular insulator, and extends through the first tubular insulator in the lengthwise direction, a second intermediate length portion that is housed in the second tubular insulator, and extends through the second tubular insulator in the lengthwise direction, and a third intermediate length portion that is positioned between the first intermediate length portion and the second intermediate length portion, is exposed from the first pipe opening end of the first tubular insulator and the first pipe opening end of the second tubular insulator in the lengthwise direction, and is bent into a U-shape between the first pipe opening end of the first tubular insulator and the first pipe opening end of the second tubular insulator.

As shown in FIG. 3, the first inner insulating layer 22 and the second inner insulating layer 32 each include first and second exposed insulating portions, which are the two end portions thereof, the inlet portion 44 and the outlet portion 45, which may be two tube end portions of the cooling tube 40, may extend through the electromagnetic shield member 50 in a radial direction, at predetermined length positions that are spaced far apart from the first exposed insulating portions of the first inner insulating layer 22 and the second inner insulating layer 32, and are close to the second exposed insulating portions of the first inner insulating layer 22 and the second inner insulating layer 32.

As shown in FIG. 4, in the wire harness unit 10 according to a preferable example, the first inner insulating layer 22 and the second inner insulating layer 32, which are tubular-shaped, may have inner circumferential surfaces that have the same inner diameter. The cooling tube 40 may have an outer circumferential tube surface having an outer tube diameter that matches or corresponds to the inner diameter of the first inner insulating layer 22 and the second inner insulating layer 32, which are tubular-shaped. The inner circumferential surface of the first inner insulating layer 22 may be in contact with the outer circumferential tube surface of the cooling tube 40, over the entire length of the first inner insulating layer 22, such that the inner circumferential surface of the first inner insulating layer 22 can or cannot move relative to the outer circumferential tube surface of the cooling tube 40. The inner circumferential surface of the second inner insulating layer 32 may be in contact with the outer circumferential tube surface of the cooling tube 40, over the entire length of the second inner insulating layer 32 such that the inner circumferential surface of the second inner insulating layer 32 can or cannot move relative to the outer circumferential tube surface of the cooling tube 40. The outer circumferential tube surface of the cooling tube 40 may be in contact with the inner circumferential surfaces of the first inner insulating layer 22 and the second inner insulating layer 32 under frictional resistance or adhesion.

The invention claimed is:

1. A wire harness unit comprising:
   a plurality of conductive paths for conducting electricity between in-vehicle devices; and
   a cooling tube through which a coolant is able to flow for cooling the plurality of conductive paths, the cooling tube being of a flexible resin material, wherein:
   the plurality of conductive paths include a first conductive path and a second conductive path parallel to the first conductive path,
   the first conductive path includes a first inner insulating layer that is hollow and tubular, and a first tubular conductor that covers an outer circumferential surface of the first inner insulating layer,
   the second conductive path includes a second inner insulating layer that is hollow and tubular, and a second tubular conductor that covers an outer circumferential surface of the second inner insulating layer,
   the cooling tube includes a first section extending through the first inner insulating layer, a second section extending through the second inner insulating layer, and a turnback portion that links the first section and the second section, and
   the first inner insulating layer and the second inner insulating layer are of synthetic resin.

2. The wire harness unit according to claim 1, wherein a number of conductive paths included in the plurality of conductive paths is an even number.

3. The wire harness unit according to claim 1, further comprising
   an exterior cover for covering the conductive paths, wherein:
   the exterior cover includes an exterior tube and a grommet that is connected to an end of the exterior tube, and
   the turnback portion is disposed inside the grommet.

4. The wire harness unit according to claim 1, wherein:
   the first tubular conductor is a first braided member formed by braiding metal strands, and
   the second tubular conductor is a second braided member formed by braiding metal strands.

5. The wire harness unit according to claim 1, further comprising
   an electromagnetic shield for covering the cooling tube and the conductive paths, wherein:
   the electromagnetic shield is a shielding braided member formed by braiding metal strands,
   the first inner insulating layer and the second inner insulating layer each include an exposed insulating portion that is exposed from the first tubular conductor or the second tubular conductor,
   the exposed insulating portion covers the cooling tube, and
   the cooling tube extends through the shielding braided member.

6. The wire harness unit according to claim 5, wherein:
   the first conductive path and the second conductive path each include a terminal and an outer insulating layer for covering an outer circumferential surface of the first tubular conductor or the second tubular conductor, the first tubular conductor and the second tubular conductor each include an exposed conductor portion that is exposed from the outer insulating layer, the exposed conductor portion is electrically connected to the terminal, and the exposed conductor portion is covered by the electromagnetic shield.

7. The wire harness unit according to claim 6, further comprising a coat for covering the exposed conductor portion.

8. The wire harness unit according to claim 1, further comprising an electromagnetic shield for covering the cooling tube and the conductive paths, wherein:

the electromagnetic shield is a shielding braided member formed by braiding metal strands, the first inner insulating layer and the second inner insulating layer each include an exposed insulating portion that is exposed from the first tubular conductor or the second tubular conductor, the exposed insulating portion covers the cooling tube, and the exposed insulating portion and the cooling tube extend through the shielding braided member.

9. The wire harness unit according to claim 1, further comprising an exterior cover for covering the conductive paths, wherein:

the exterior cover includes an exterior tube and a grommet connected to an end of the exterior tube, and the cooling tube extends through the grommet.

10. A wire harness unit comprising:

a plurality of conductive paths for conducting electricity between in-vehicle devices;

a cooling tube through which a coolant is able to flow for cooling the plurality of conductive paths, wherein:

the plurality of conductive paths include a first conductive path and a second conductive path parallel to the first conductive path, the first conductive path includes a first inner insulating layer that is hollow and tubular, and a first tubular conductor that covers an outer circumferential surface of the first inner insulating layer, the second conductive path includes a second inner insulating layer that is hollow and tubular, and a second tubular conductor that covers an outer circumferential surface of the second inner insulating layer, and the cooling tube includes a first section extending through the first inner insulating layer, a second section extending through the second inner insulating layer, and a turnback portion that links the first section and the second section; and an electromagnetic shield for covering the cooling tube and the conductive paths, wherein:

the electromagnetic shield is a shielding braided member formed by braiding metal strands, the first inner insulating layer and the second inner insulating layer each include an exposed insulating portion that is exposed from the first tubular conductor or the second tubular conductor, the exposed insulating portion covers the cooling tube, and the cooling tube extends through the shielding braided member.

11. A wire harness unit comprising:

a plurality of conductive paths for conducting electricity between in-vehicle devices;

a cooling tube through which a coolant is able to flow for cooling the plurality of conductive paths, wherein:

the plurality of conductive paths include a first conductive path and a second conductive path parallel to the first conductive path, the first conductive path includes a first inner insulating layer that is hollow and tubular, and a first tubular conductor that covers an outer circumferential surface of the first inner insulating layer, the second conductive path includes a second inner insulating layer that is hollow and tubular, and a second tubular conductor that covers an outer circumferential surface of the second inner insulating layer, and the cooling tube includes a first section extending through the first inner insulating layer, a second section extending through the second inner insulating layer, and a turnback portion that links the first section and the second section; and an exterior cover for covering the conductive paths, wherein:

the exterior cover includes an exterior tube and a grommet connected to an end of the exterior tube, and the cooling tube extends through the grommet.

\* \* \* \* \*